United States Patent [19]

Chen et al.

[11] Patent Number: 5,521,867
[45] Date of Patent: May 28, 1996

[54] ADJUSTABLE THRESHOLD VOLTAGE CONVERSION CIRCUIT

[75] Inventors: Jian Chen, Sunnyvale; Lee E. Cleveland; Shane Hollmer, both of Santa Clara; Ming-Sang Kwan, San Leandro; David Liu, Cupertino; Nader Radjy, Palo Alto, all of Calif.

[73] Assignee: Advanced Micro Devices, Inc., Sunnyvale, Calif.

[21] Appl. No.: 160,057

[22] Filed: Dec. 1, 1993

[51] Int. Cl.$^6$ .................................................. G11C 11/34
[52] U.S. Cl. .............................. 365/185.33; 365/185.02; 365/185.24; 365/185.29
[58] Field of Search .................................. 365/900, 185, 365/218, 182, 185.02, 185.33, 185.29, 185.30, 185.24

[56] References Cited

U.S. PATENT DOCUMENTS

| | | | |
|---|---|---|---|
| 5,295,107 | 3/1994 | Okazawa et al. | 365/218 |
| 5,297,081 | 3/1994 | Challa | 365/184 |
| 5,357,476 | 10/1994 | Kuo et al. | 365/185 X |
| 5,406,521 | 4/1995 | Hara | 365/218 X |

FOREIGN PATENT DOCUMENTS

| | | |
|---|---|---|
| 0501289A2 | 9/1992 | European Pat. Off. . |
| 0509184A1 | 10/1992 | European Pat. Off. . |
| 0621604A1 | 10/1994 | European Pat. Off. . |

OTHER PUBLICATIONS

Patent Abstracts of Japan, vol. 16, No. 8 (E–1152), Jan. 10, 1992 & JP–A–03 230566 (Mitsubishi Electric Corp.) Oct. 14, 1991, Abstract.
"A Self–Convergence Erasing Scheme for A Simple Stacked Gate Flash EEPROM," Yamada, et al., *IEEE*, 1991, pp. 91–307–91.310.
"Device Performance Degradation Due To Hot–Carrier Injection At Energies Below The Si–SiO$_2$ Energy Barrier," Takeda, et al., *IEEE*, 1983, pp. 83–396–83—399.
Haddad et al., "An Investigation of Erase–Mode Dependent Hole Trapping in Flash EEPROM Memory cell", Nov. 1990, vol. 11, IEEE pp. 514–516.
Haddad et al., "Degradations due to Hole Trapping in Flash Memory cells", Mar. 1989, vol. 10, IEEE, pp. 117–119.

Primary Examiner—David C. Nelms
Assistant Examiner—Huan Hoang
Attorney, Agent, or Firm—Fliesler, Dubb, Meyer & Lovejoy

[57] ABSTRACT

A flash EPROM circuit for providing a tight erase threshold voltage distribution. The circuit includes an array of memory cells having gates, sources and drains. Bit lines are coupled to the drains of a column of cells in the memory array. A plurality of word lines are each coupled to the gates of a row of cells in the memory array. A first voltage source is coupled to the bit lines to converge threshold voltages of erased memory cells. A second voltage source is coupled to the word lines to control the threshold voltages of the erased memory cells.

34 Claims, 9 Drawing Sheets

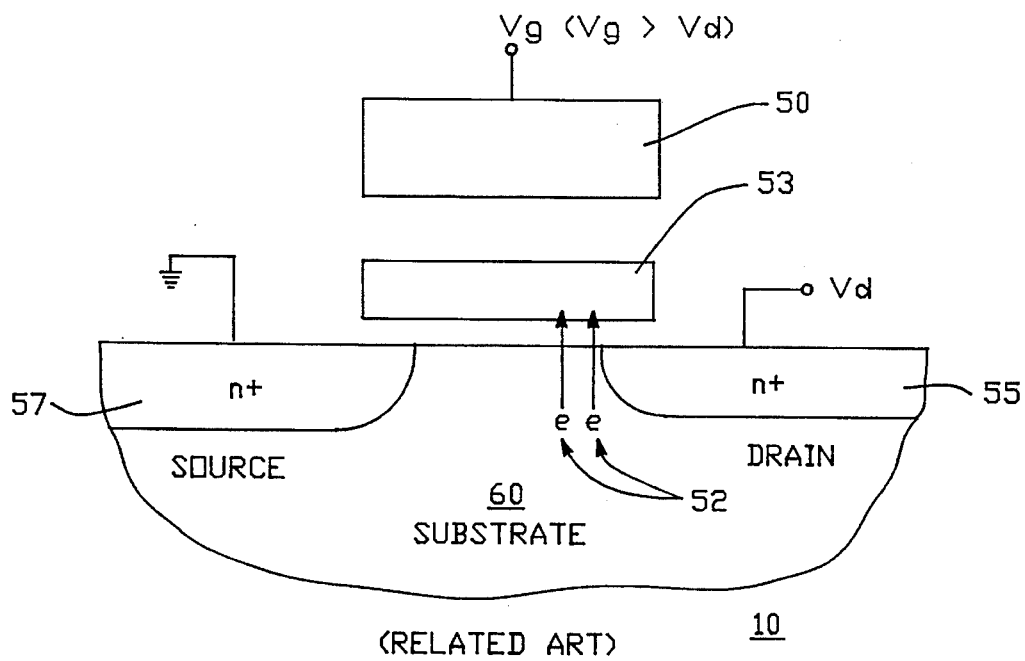
(RELATED ART)
FIG.—1
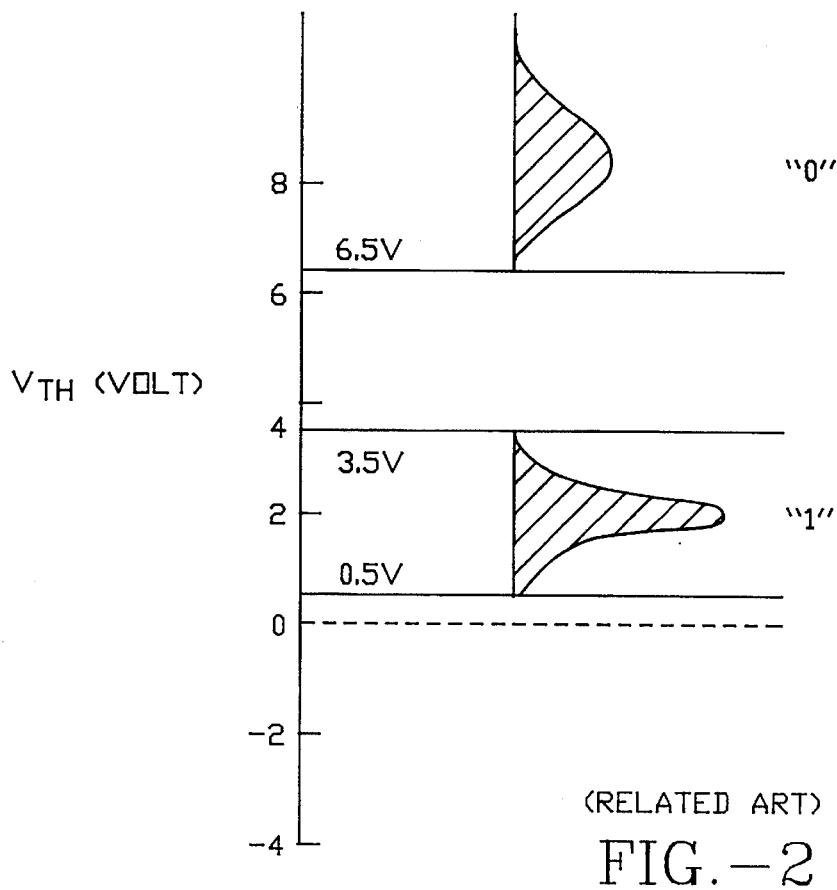
(RELATED ART)
FIG.—2

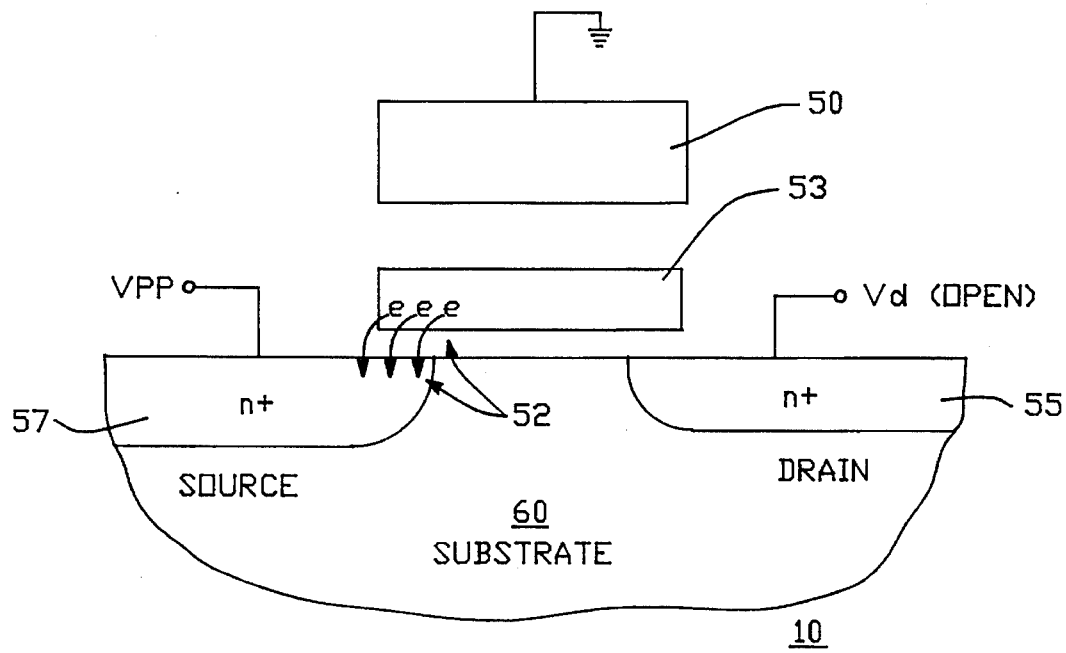
(RELATED ART)
FIG.—3
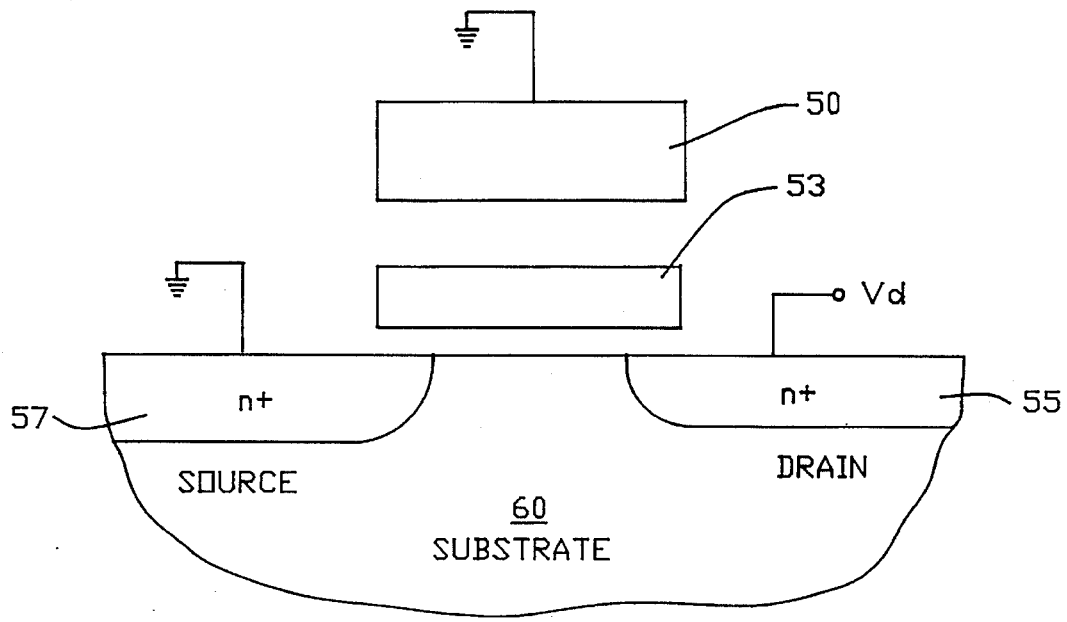
(RELATED ART)
FIG.—3a

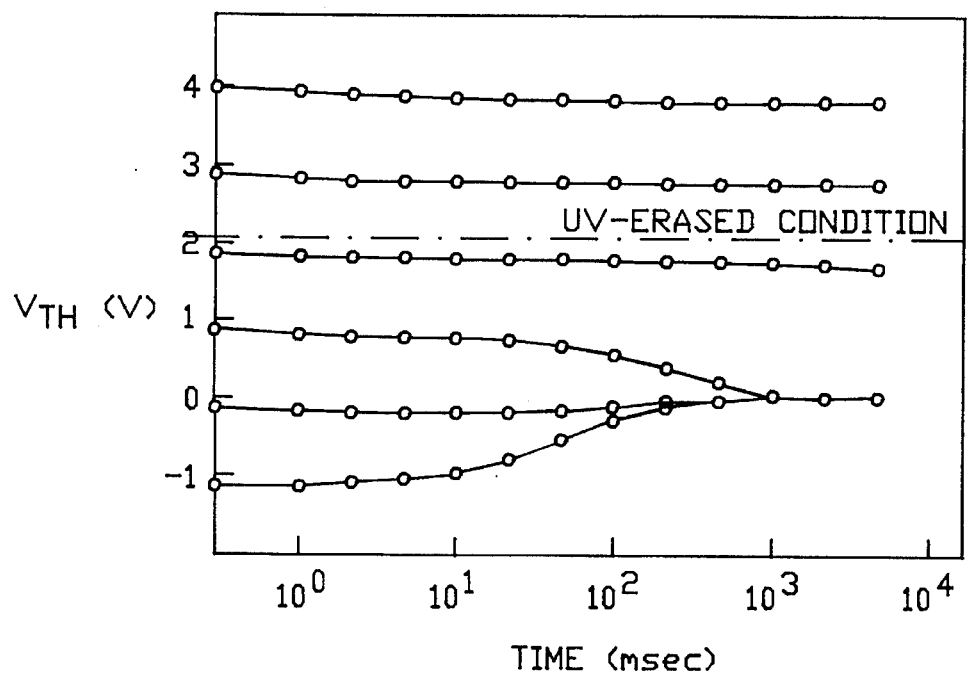
(RELATED ART)
FIG.—3b
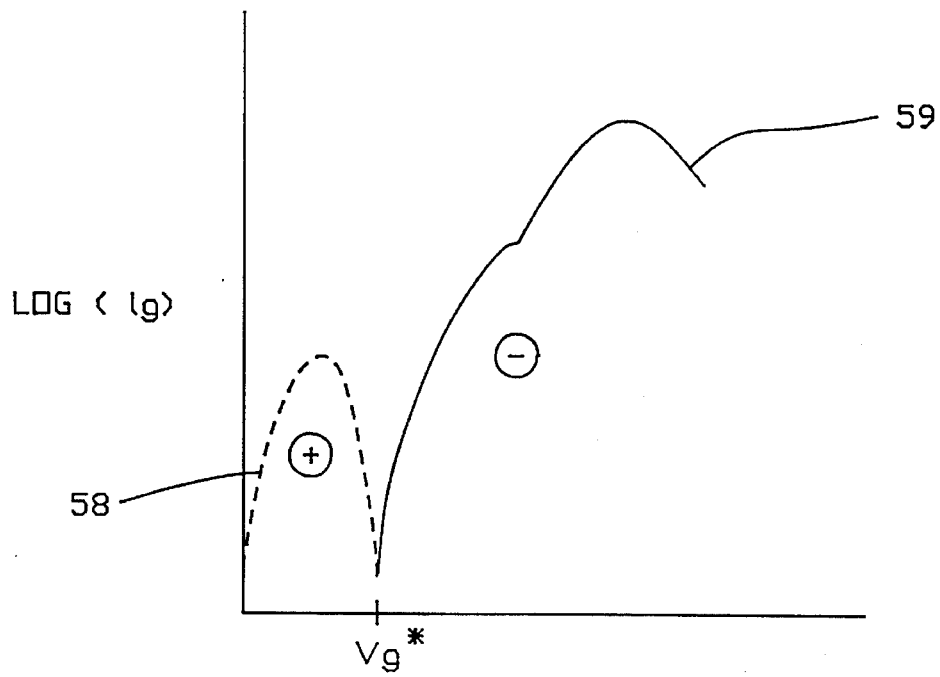
(RELATED ART)
FIG.—3c

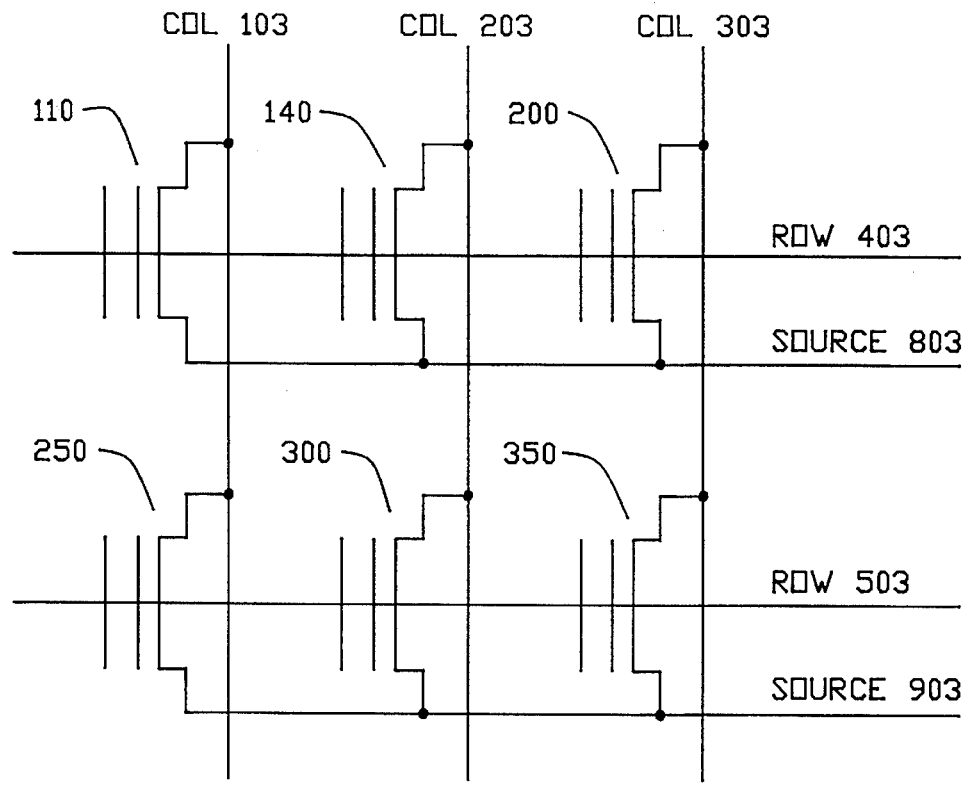
FIG.—4a
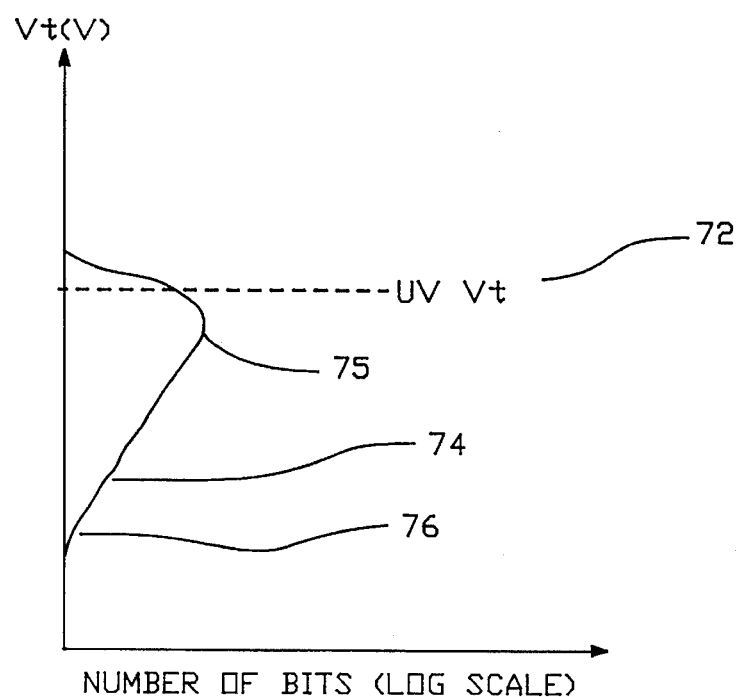
FIG.—5

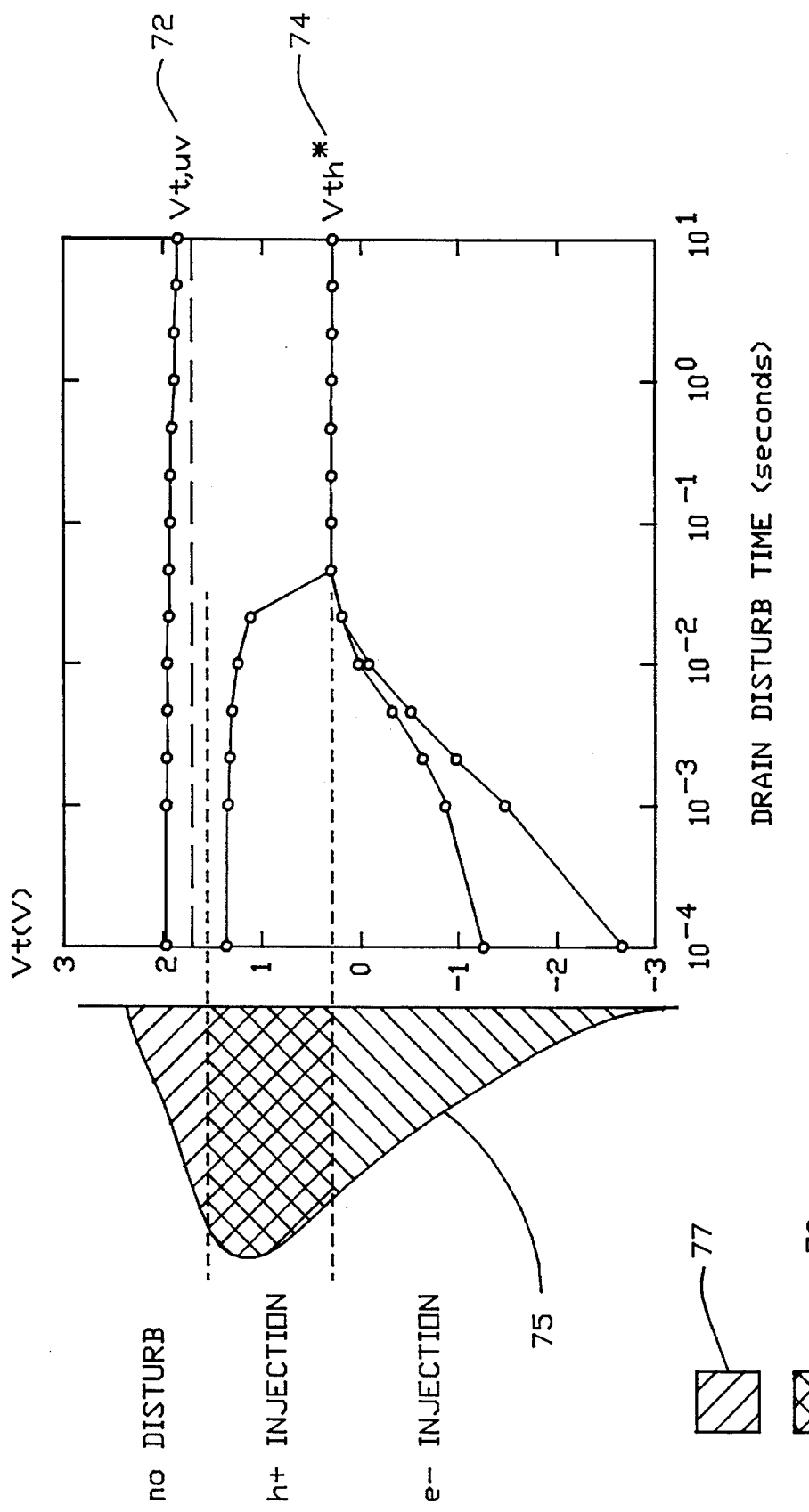
FIG.—5a

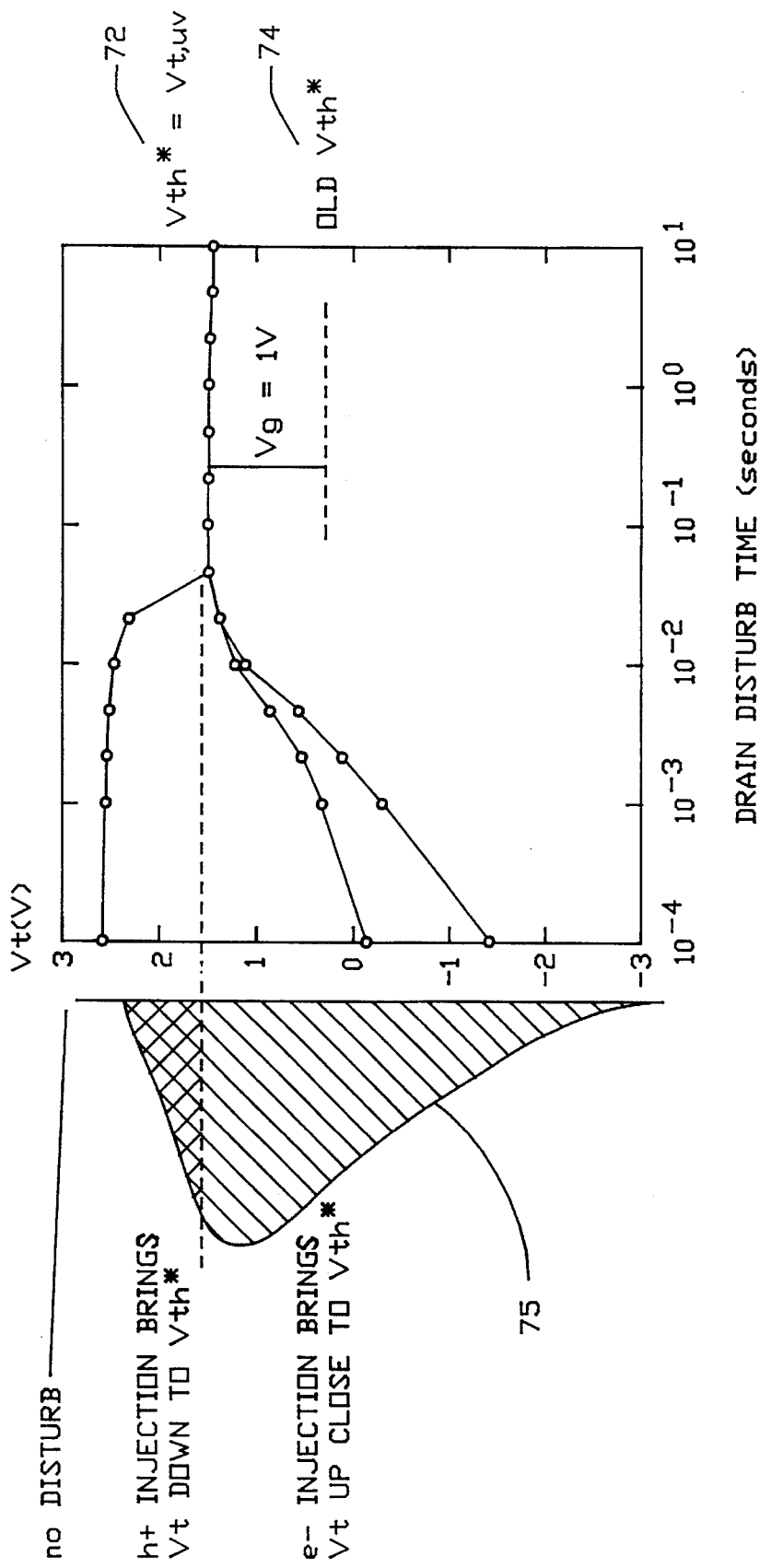
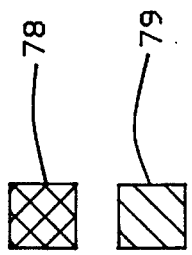
FIG.-8

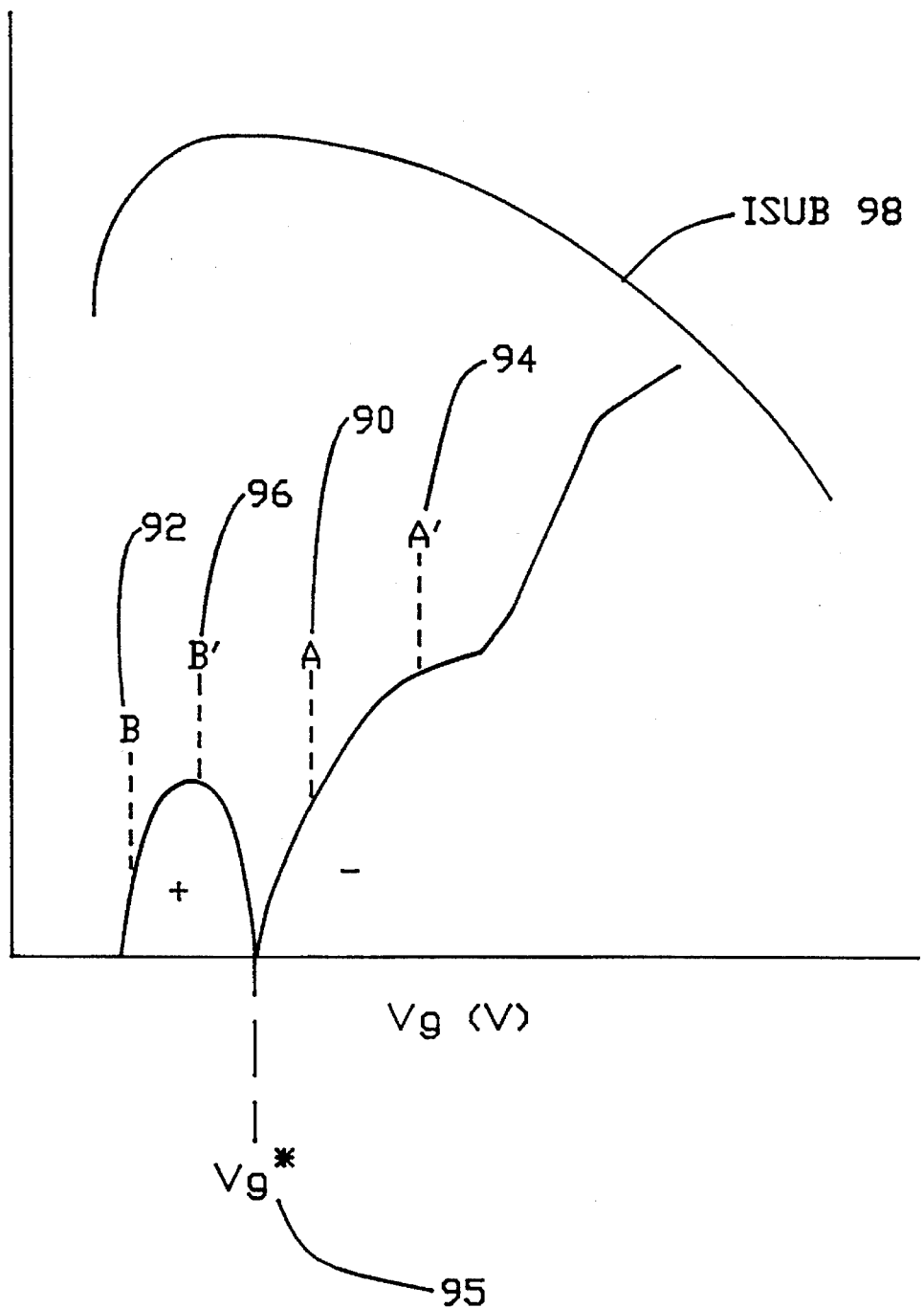
FIG.—9

ADJUSTABLE THRESHOLD VOLTAGE CONVERSION CIRCUIT

BACKGROUND OF THE INVENTION

1. Field of the Invention

The present invention relates to memories for computers and other electronic devices, and more particularly, to flash memories and circuits that control the threshold voltage distribution of the flash memories after erase.

2. Description of Related Art

Flash EPROMs (erasable programmable read only memories) are a growing class of non-volatile storage integrated circuits. These flash EPROMs have the capability of electrically erasing, programming or reading a memory cell in the chip. The entire array can be simultaneously erased electrically. The flash EPROM can also be randomly read or written.

The cells themselves use only a single device per cell and are formed using so-called floating gate transistors in which the data is stored in a cell by charging or discharging the floating gate. The floating gate is a conductive material, typically made of polysilicon, which are insulated from the channel of the transistor by a thin layer of oxide or other insulating material, and insulated from the control gate word line of the transistor by a second layer of insulating material.

The act of charging the floating gate is termed the "program" step for a flash EPROM. This is accomplished through a so-called hot-electron injection by establishing a large positive voltage between the gate and source, as much as 12 volts, and a positive voltage between the drain and source, for instance, 7 volts.

The act of discharging the floating gate is called the "erase" function for a flash EPROM. This erasure function is typically carried out by a Fowler-Nordheim tunneling mechanism between the floating gate and the source of the transistor (source erase) or between the floating gate and the substrate (channel erase). For instance, a source erase operation is induced by establishing a large positive voltage from the source to gate, while floating the drain of the respective memory cell. This positive voltage may be as much as 12 volts.

FIG. 1 depicts flash memory cell 10, which is an EPROM with tunnel oxide. Memory cell 10 is formed on a p-substrate 60. Source 57 and drain 55 are formed in substrate 60. Floating gate 53 separates control gate 50 from drain 55 and source 59.

In order to programmemory cell 10, the threshold voltage of the cell is raised by means of channel-hot electron injection. Control gate 50 and drain 55 are connected to a high voltage, and source 59 is connected to ground. The Vg voltage applied to gate 50 is greater than the Vd voltage applied to drain 55. Electrons 52 are forced into floating gate 53 by means of channel-hot electron injection. The electrons charge the floating gate of cell 10. The threshold voltage is changed to a high threshold state, and cell 10 is in a programmed state. In this programmed state, when a read voltage is applied to cell 10, the read voltage is not high enough to cause memory cell 10 to turn on or conduct.

FIG. 2, is a plot of a threshold voltage distribution of programmed and erased memory cells. The X-axis represents the number of memory cells and the Y-axis corresponds to the threshold voltage of memory cells. Inherent variations in the tolerance and processing of the memory cells cause the threshold voltage of the memory cells to be distributed. Referring to FIG. 2, the threshold voltage of cells in the programmed state is greater than 6.5 volts and the threshold voltage of cells in the erased state is limited from 0.5 volts to 3.5 volts.

Erasing of the memory cell by source erase is accomplished by moving the electrons from the floating gate to the source. Removing the electrons from the floating gate lowers the threshold voltage of the memory cell and cause the memory cell to turn on or conduct when the read voltage is applied.

FIG. 3 depicts memory cell 10 as it is erased from a programmed state. Erasing is preformed by Fowler-Nordheim tunneling of the electrons from the floating gate to the source diffusion layer by grounding control gate 50 and applying a high voltage to source 57. The Vpp voltage applied to source 57 can be as much as 12 volts. Electrons 52 are moved from floating gate 53 to source 57.

Erasing of the memory cells can be done by repeated applications of the Vpp voltage to the source. After each application of the Vpp voltage, which can last about 100 msec, a read voltage is applied to the memory cells and the draw current of the memory cells are measured. The draw current is measured to verify that the memory cells are properly erased. If the measured draw current is lower than expected, there are memory cells that are not completely erased. Memory cells that are programmed will not draw current during the read mode, thus, by measuring the draw current it is possible to verify whether the memory cells are properly erased. Repeated pulses of the Vpp voltage is applied to the source until the measured draw current is within the specified limits to indicate the proper erasure of the memory cells.

The number of repeated applications of the Vpp voltage varies between cells because variations in the tolerance and processing cause different behaviors between memory cells. Other factors also affect the behavior of memory cells. For instance, as the number of program and erase cycles experienced by the memory cells increase, the number of Vpp applications also increases before the memory cells can be properly erased.

Excessive applications of Vpp to electrically erase the memory cells cause undesirable effects to memory cells. One characteristic of negative gate erase is that it is not self-limiting. A phenomena known as over-erasing occurs when too many electrons are removed from the floating gate which leaves the floating gate positively charged. Over-erasing is caused by the repeated application of the Vpp pulse to a memory cell that has already been properly erased. Different memory cells require a different number of Vpp applications to be properly erased. Memory cells that require less number of Vpp applications will be over-erased because electrical erase is not self-limiting. Each application of the Vpp voltage removes electrons from the floating gate to the source. When too many electrons are removed from the floating gate by repeated applications of Vpp voltage, the memory transistor becomes a depletion-mode transistor or a transistor that is always turned on. The depletion mode transistor causes bit-line leakage current during reading of the cells and causes false readings. More importantly, the leakage current draws power away from the programming voltage which reduces the programming voltage and causes the programming of cells to fail.

There have been several solutions to the over-easing problem. A series enhancement transistor used in electrically erasable programmable read only memories (EEPROMs) can be employed to prevent the leakage current. The memory cell can be viewed as two transistors in series. One transistor is a floating-gate memory transistor, similar to memory cell 10. The other transistor is a simple enhancement transistor controlled by the control gate of the memory transistor. The series enhancement transistor is used as a select transistor to provide access to the memory cell only when the memory cell is selected. The leakage current caused by over-erasing is avoided by not permitting the over-erased transistors to contribute to the read current. The drawbacks of the enhancement transistor are the loss of space for memory cells and the added complexity of the select circuit.

A technique called verified-erase can be used to reduce the over-erase problem. An initial erase step is carried out by erasing from the source junction of all cells in the memory array. The erase voltage is applied to the sources with all control gates grounded. Subsequently, a read operation is performed with a voltage of approximately 3.2 volts applied to the control gate. The voltage applied is the upper limit for the threshold voltage of a cell in the erase state. The current for the memory cells is measured to determine whether the memory cells have been erased. If some bits require more time to reach the erase state, erasing is performed again. The erase verify sequence is repeated until all cells in the array have a threshold voltage of at least the upper limit for the threshold voltage of a cell in the erase state. Given that read operations are performed at 5 volts, this ensures removal of a sufficient amount of charge from the floating gate with a margin for safety over the minimum required for successful erase. The verified-erase technique does not provide a solution but avoids the problem of over-erasing.

A self-convergence erasing mechanism can be used to solve the over-erasing problem. This mechanism is described in a published paper entitled "A Self-Convergence Erasing Scheme For A Simple Stacked Gate Flash EPROM," IEEE *Tech. Dig.* IEDM 1991, pp 307–310. The publication was presented by S. Yamada, T. Suzuki, E. Obi, M. Oshikiri, K. Naruke, and M. Wada. The self-convergence erasing mechanism utilizes avalanche-hot carrier injection after erasure by Fowler-Nordheim tunneling. The avalanche-hot carrier injection causes the threshold voltages of the memory cells to converge to a certain "steady-state". The steady-state is reached when there is a balance between avalanche-hot electron injection and avalanche-hot hole injection of the floating gate. Using this mechanism, the threshold voltage of over-erased memory cells can be raised to a higher level.

Referring to FIG. 3a, memory cell 10 is connected to perform the self-convergence erasing mechanism. A drain voltage Vd of approximately 6 volts is applied to drain 55. Gate 50 and source 57 are grounded. The drain voltage Vd is applied until the threshold voltages of the memory cells converge to a steady-state.

FIG. 3b as disclosed in Yamada, et al. plots the threshold voltages for a flash memory cell as a function of the drain disturb time with different starting threshold voltages as parameters. The X-axis represents the drain disturbed time in milliseconds and the Y-axis represents the threshold voltage of the memory cells. The findings of Yamada, et al. show that threshold voltages that are below the UV-erased condition are effected by the drain disturb voltage. The effects of the drain disturb voltage cause the threshold voltages to converge to a steady-state threshold voltage.

FIG. 3c is also disclosed in Yamada, et al. FIG. 3c plots the characteristics of the gate current Ig as a function of the gate voltage Vg for the memory cells. The X-axis represents the gate voltage Vg, and the Y-axis represents the log of the gate current. Vg* represents the point where hole injection and electron injection are in balance. Data trace 58 shows that the avalanche-hot hole injection occurs at low bias when the gate voltage Vg is greater than 0 volts but is less than Vg*. Data trace 59 shows that channel-hot electron injection occurs at a higher gate bias. Electron injection occurs at gate voltages greater than Vg*.

In a stacked gate structure such as a floating gate, three scenarios occur depending on the value of the gate voltage Vg. The first scenario is represented by data trace 59 where the gate voltage Vg is greater than Vg*. Electrons are injected into the floating gate which decreases the gate voltage until the gate voltage equals Vg*. The second scenario is represented by data trace 58 where holes are injected into the floating gate. The injected holes increase the gate voltage until the gate voltage equals Vg*. The third scenario is where the gate voltage is less than 0 volts. Channel electron induced hot carrier injection does not occur when the gate voltage is less than 0 volts.

As shown in FIG. 3b, the effect of drain disturb upon threshold voltages that are near or above the UV-erased condition (UV-Vt) is minimal. The threshold voltages do not shift as a result of the drain disturb voltage. Only those threshold voltages lower than the UV-erased condition are effected by the drain disturb voltage and converge to a steady-state.

The self-convergence mechanism provides an intermediate solution to the problems of over-erasing. Avalanche-hot carrier injection is utilized to converge the threshold voltages to a steady-state. However, avalanche-hot hole injection of the gate is known to cause device degradation. Device degradation effects the longevity and reliability of the device. Although the self-convergence mechanism does provide a tighter threshold voltage distribution after erase, the disadvantage is that the distribution spread is limited to the difference between UV-Vt and the steady-state convergence threshold voltage. As FIG. 3b shows, the distribution between UV-Vt and the steady-state convergence threshold voltage is around 2 volts. Tightening the distribution spread is desirable because designed safety margins accounting for the distribution spread of the threshold voltages can be reduced. Speed is also a major consideration in memory devices. Any increase in speed at which devices can operate is further desirable.

Accordingly, disadvantages of the current self-convergence mechanism include device degradation affecting reliability, set threshold voltage distribution spread, and the self-convergence speed.

Therefore, it is desirable to design a circuit to provide a tight voltage threshold distribution that improves and overcomes the disadvantages of the prior art.

SUMMARY OF THE INVENTION

The present invention provides a circuit to achieve a tight erase threshold voltage distribution of memory cells. The circuit converges the erase threshold voltage distribution to a certain steady-state threshold voltage that is above the self-convergence steady-state threshold voltage. A tighter erase threshold voltage distribution of the memory cells is obtained. According to the present invention, a flash EPROM comprises an array of memory cells having gates, sources and drains. A plurality of bit lines are each coupled to the drain of a column of cells in the memory array. A plurality of word lines are each coupled to the gates of a row of cells in the memory array. A first voltage source is coupled to the bit line to converge threshold voltages of erased memory cells. A second voltage source is coupled to the word lines to control the threshold voltages of the erase memory cells to achieve a tight threshold voltage distribution. The application of the first voltage causes hole injection and electron injection when the threshold voltages of the erased memory cells are converged. Hole injection is known to cause oxide breakdown that effects the reliability of the memory device. In order to avoid subjecting the memory cells to the destructive hole injection, according to one aspect of the invention, the second voltage controls the threshold voltages of the erased memory cells so that hole injections can be reduced or eliminated. According to another aspect of the invention, the second voltage is derived from the first voltage so that one power supply can be used to supply the power for the circuit.

The invention can be characterized as a memory cell comprising a MOS device having a floating gate source and drain. A ground is coupled to the source of the memory cell. A first voltage is coupled to the drain to obtain a steady-state threshold voltage for the M0S device, and a second voltage is coupled to the gate to offset the steady-state threshold voltage. The steady-state threshold voltage is obtained by hot-carrier injection. The hot-carrier injection includes hot-electron injection and hot-hole injection of the floating gate to obtain the steady-state threshold voltage. According to another aspect of the invention, the second voltage is less than the first voltage, and the second voltage offsets the steady-state threshold voltage to a greater threshold voltage.

The invention can also be characterized as a flash EPROM comprising an array of memory cells having floating gates, sources and drains. A plurality of bit lines are each coupled to the drains of a column of cells in the memory array and a plurality of word lines are each coupled to the floating gates of a row of cells in the memory array. There is a first set of erased memory cells having a first threshold voltage distribution, and a second set of erased memory cells of the array of memory cells having a second threshold voltage distribution. A first voltage source is coupled to the bit lines to converge the second threshold voltage distribution of the second set of erased memory cells. A second voltage source is coupled to the word lines to offset the second threshold voltage distribution of the second set of erased memory cells. The second threshold voltage distribution is brought closer to the first threshold distribution to achieve a tight after erase threshold voltage distribution.

According to another aspect of the invention, hot-hole injection into the floating gate is reduced. The second threshold voltage distribution of the second set of erased memory cells are converged by hot carrier injection. The hot carrier injection includes hot-electron injection and hot-hole injection of the floating gate. The second voltage offsets the second threshold distribution of the second set of erased memory cells to reduced hot-hole injection of the floating gate. The second threshold distribution of the second set of erased memory cells is offset towards the first threshold voltage distribution. The erased memory cells are a subset of the array of memory cells.

According to another aspect of the invention, the first voltage source coupled to the bit lines converges the second threshold voltage distribution of the second set of erased memory cells to a steady-state threshold voltage. The second voltage source coupled to the word lines shifts the steady-state threshold towards the first threshold voltage distribution. The second voltage source does not effect the first threshold distribution.

The present invention is particularly suited for erase circuits in a nonvolatile memory device that is programmable by the application of programming voltage. The invention ensures a predictable and tight threshold voltage distribution of the erased memory cells. Thus, the use of the preferred embodiment of the present invention affords greater efficiency and utilization of nonvolatile memory devices.

Other aspects and advantages of the present invention can be seen upon review of the Figures, the detailed description, and the claims which follow.

BRIEF DESCRIPTION OF THE DRAWINGS

The invention will be better understood by reference to the Figures of the drawings wherein like numbers denote like parts throughout and wherein:

FIG. 1 is a schematic description of programming a flash memory cell by channel-hot electron injection;

FIG. 2 is a plot of threshold voltage distribution of programmed and erased memory cells;

FIG. 3 is a schematic description of a flash memory cell being erased by Fowler-Nordheim tunneling of electrons from the floating gate to the source;

FIG. 3a is a schematic description of a flash memory cell connected to perform a self-convergence erase operation;

FIG. 3b is a plot of threshold voltage versus drain disturb time showing the effect of drain disturb time on different starting threshold voltages as parameters;

FIG. 3c is a plot of gate current Ig versus gate voltage Vg of the memory cells;

FIG. 4a is a section of the flash memory device;

FIG. 5 is a plot of threshold voltage versus the number of bits showing the erase distribution of the cells of the flash memory device;

FIG. 5a is a plot of threshold voltage versus drain disturb time showing the after erase distribution converge to a steady-state threshold voltage;

FIG. 8 is a plot of threshold voltage versus drain disturb time with a gate voltage applied showing the shift of the steady-state convergence threshold voltage; and FIG. 9 is a plot of the gate current Ig versus the gate voltage Vg showing the effect of a gate voltage during steady-state convergence of the threshold voltage.

DETAILED DESCRIPTION

Figure 4:
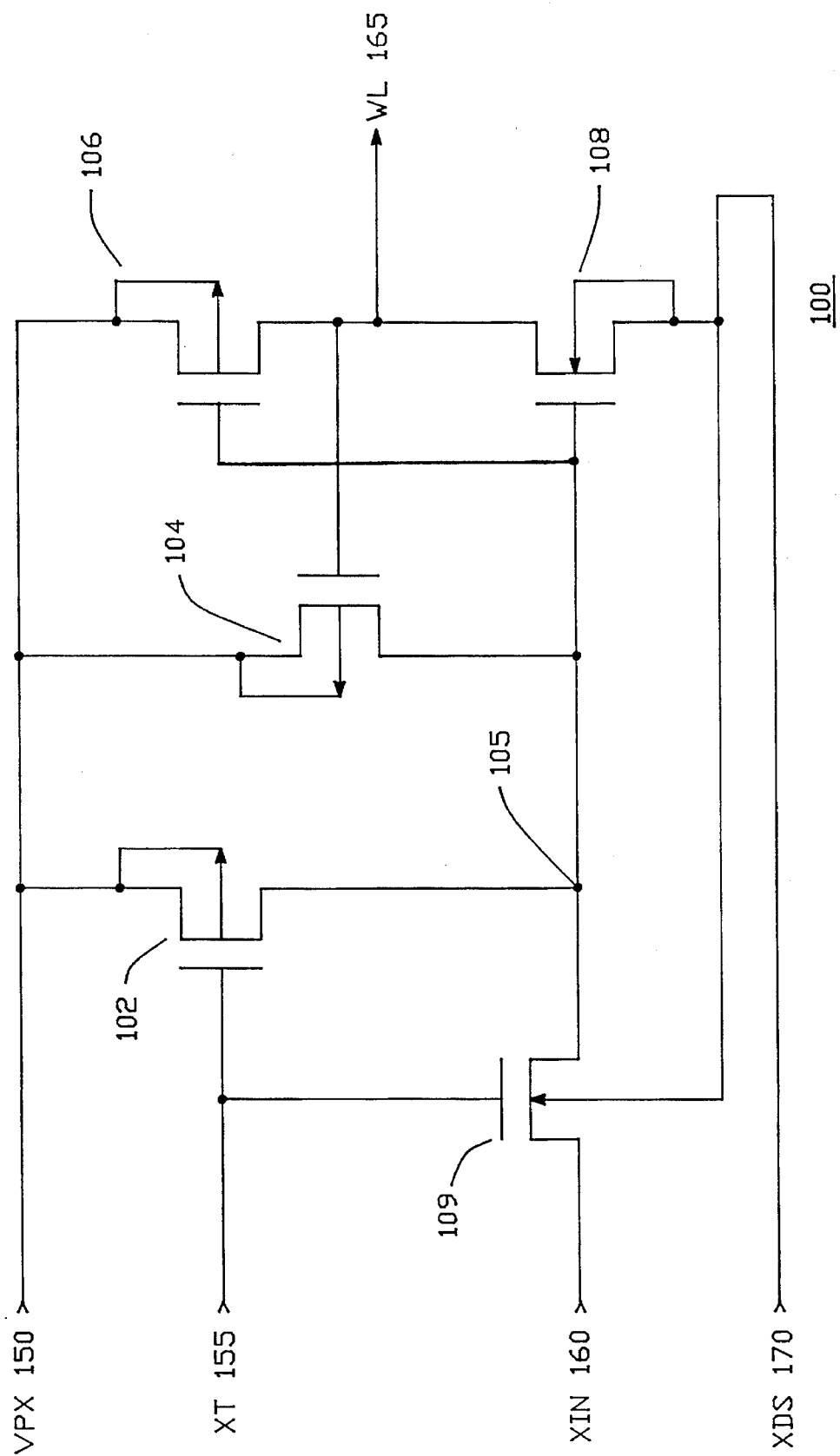
FIG. 4 is a select circuit for a flash memory device.

FIG. 4 is a preferred embodiment of select circuit 100 of a flash memory device. The devices depicted in the Figures are fabricated using metal-oxide-semiconductor (MOS) processing. More specifically, complimentary metal-oxide-semiconductor (CMOS) technology is used to fabricate the transistor devices. N-type devices are formed in a p-substrate, and p-type devices are formed in the n-wells, the n-wells being first formed in the p-substrate.

Referring to select circuit 100 of FIG. 4, the source and substrate of p-channel devices 102, 104 and 106 are coupled to signal VPX 150. The drain of p-channel devices 102 and 104 are coupled to node 105. Signal XT 155 is coupled to the gate of p-channel device 102 and the gate of n-channel device 109. Signal XIN 160 is coupled to the source of n-channel device 109. The drain of n-channel device 109 is coupled to node 105. The gate of p-channel device 106 and n-channel device 108 are coupled to node 105. The gate of p-channel device 104 is coupled to the drains of p-channel device 106 and channel device 108. Signal WL 165 is coupled to the gate of p-channel device 104. Signal XDS 170 is coupled to the substrate of n-channel device 109 and the source and substrate of n-channel device 108.

In the preferred embodiment, select circuits are coupled to an array of memory cells in the flash memory device. FIG. 4a is a segment of the array of memory cells in the preferred embodiment. Memory cell segment 101 consists of memory cells 110, 140, 200, 250, 300, and 350. Column 103 is coupled to the drain of memory cell 110 and the drain of memory cell 250. Column 203 is coupled to the drain of memory cell 140 and the drain of memory cell 300. Column 303 is coupled to the drain of memory cell 200 and the drain of memory cell 350. Row 403 is coupled to the gate of memory cell 110, the gate of memory cell 140, and the gate of memory cell 200. Row 503 is coupled to the gate of memory cell 250, the gate of memory cell 300, and the gate of memory cell 350. The source of memory cell 110, the source of memory cell 140, and the source of memory cell 200 are coupled to source line 803. The source of memory cell 250, the source of memory cell 300, and the source of memory cell 350 are coupled to source line 903. In order to program, read or erase the memory cells, signals are applied to the row or word lines, column or bit lines and source lines.

Select circuit 100 is coupled to memory cell segment 101. Select circuit 100 controls voltage inputs to the gates or word line of the memory cells. WL 165 is coupled to Row 403 and controls the input voltage to the gates of memory cells 110, 140 and 200. Similar select circuits are coupled to memory cells 250, 300, and 350 and other segments of the memory array.

In a program sequence, program voltage of around 10 volts is applied to the gates of memory cells 110, 140, and 200. Referring to FIG. 4, the inputs of the select circuit 100 are VPX 150, XT 155, XIN 160, and XDS 170. Output WL 165 is coupled to the gates of memory cells 110, 140, and 200 via Row 403 of FIG. 5a. VPX 150 is supplied with the program voltage. XT 155 is raised to the programmed voltage which turns off p-channel device 102 and turns on n-channel device 109. XIN 160 is supplied a logic low which causes node 105 to be a logic low. Node 105 is coupled to the gate of p-channel device 106 and the gate of n-channel device 108. XDS is supplied a logic low to prevent n-channel device 108 from conducting. The logic low on node 105 causes p-channel device 106 to turn on or conduct which couples program voltage VPX 150 to the gates of memory cells 110, 140, and 200.

In a read sequence, Vcc or 5 volts is applied to the gates of memory cells 110, 140, and 200. Select circuit 100 is configured with inputs similar to the program sequence with the exception that the program voltage is substituted for a read voltage. VPX 150 is supplied with the read voltage (Vcc or 5 volts). XT 155 is raised to a logic high which turns off p-channel device 102 and turns on n-channel device 109. XIN 160 is supplied a logic low which causes node 105 to be a logic low. Node 105 is coupled to the gate of p-channel device 106 and the gate of n-channel device 108. XDS is supplied a logic low to prevent n-channel device 108 from conducting. The logic low on node 105 causes p-channel device 106 to turn on or conduct which couples read voltage VPX 150 to the gates of memory cells 110, 140, and 200.

In a erase sequence, a voltage around −10 volts is applied to the gates of memory cells 110, 140, and 200. Inputs VPX 150 and XIN 160 are at a logic low or grounded. A voltage of around −10 volts is supplied to XDS 170. XT 155 is set to a logic low which turns off n-channel device 109 and turns on p-channel device 102. N-channel device 108 turns on and conducts the −10 volts to memory cells 110, 140, and 200.

N-channel device 108 is a triple n-well device. A triple n-well device can conduct even when the source of the device is connected to a negative voltage. As long as the voltage potential between the gate and source Vgs is sufficient to turn on the device, a triple n-well device will turn on and conduct. Therefore, negative voltages applied to the source can be coupled using a triple n-well device. Unlike typical n-channel devices that are formed in the p-substrate, a triple n-well device is formed in a p-well that is formed in a n-well formed in the p-substrate. The source of a triple n-well device is isolated from the p-substrate, therefore, the triple n-well device can respond to negative source voltages. If the voltage between the gate and source is sufficient to turn of the device, a triple n-well device will conduct even when the gate is a logic low.

Instead of using a triple n-well device for n-channel device 108, a combination of typical devices can be substituted to perform the same functions as triple n-channel device 108.

FIG. 5 is a plot of a typical after program and erase distribution of memory cells in the memory array of the preferred embodiment. The memory cells were erased following the illustration of FIG. 3a. A drain voltage Vd of approximately 6 volts is applied to drain 55 while gate 50 and source 57 are grounded. The X-axis represents the number of bits plotted on a log scale, and the Y-axis represents the threshold voltage of the memory cells. The threshold voltage of the memory cells is shown in distribution 75. UV-Vt 72 is represented in distribution 75 and is a reference voltage to compare the threshold voltages of other erased memory cells. UV-Vt 72 is the ideal after erase threshold voltage and can be obtained by ultraviolet exposure of the memory cells. Reference 74 represents the steady-state threshold voltage utilizing the self-convergence mechanism. Reference 76 represents over-erased memory cells.

A similar erase distribution 75 can be obtained by applying the corresponding drain voltages Vd to the sources while the gates and the drains of the memory cells are grounded.

FIG. 5a represents a plot of memory cells of distribution 75 as the threshold voltages converge to a certain "steady-state." Applying the self-convergence mechanism as discussed in Yamada, et al. to the erased memory cells in distribution 75, the drain of the memory cells is disturbed with 6.5 volts, and 0 volts is applied to the gate of the memory cells. Region 77 represents memory cells with threshold voltages above the UV-erased threshold voltage 72 and thus are not effected by the drain disturb voltage. The memory cells do not converge to the steady-state voltage threshold 74 and are not disturbed by the drain disturb voltage. Region 78 represents memory cells that are injected with holes to the floating gate-when the drain disturb voltage is applied. FIG. 5a shows that the hole injection reduces the threshold voltage of the memory cells in region 78 to the steady-state threshold voltage 74. Region 79 represents memory cells that are injected with electrons to the floating gate. The electron injection increases the threshold voltage of the memory cells to converge at the steady-state threshold voltage 74.

Figure 6:
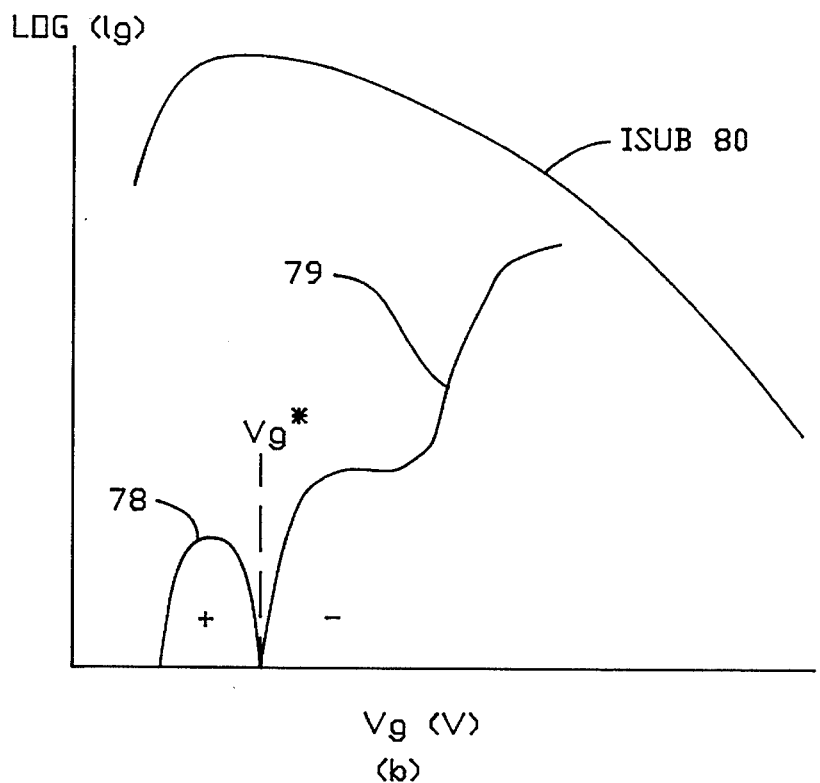
FIG. 6 is a plot of gate current Ig versus gate voltage Vg for a memory cell, and a plot of the substrate current Isub versus gate voltage Vg.

FIG. 6 is a graph representing the gate current Ig versus gate voltage Vg, and a graph of the substrate current Isub versus gate voltage Vg of the memory cells. The data is plotted during a self-convergence operation. The X-axis is the gate voltage Vg of a memory cell. The voltage Vg* is the point where hole injection and electron injection are in balance and represents the point when the memory cells converge to the steady-state threshold voltage. The Y-axis is the log of the gate current Ig. Data trace 78 corresponds to where holes are injected to the floating gate. Data trace 79 corresponds to where electrons are injected into the floating gate. Data trace Isub 80 corresponds to the substrate current of the memory cells.

Steady-state threshold voltage Vth* can be written as a function of different operation conditions. These conditions include the drain disturb voltage Vd, gate disturb voltage Vg, and device parameters which include UV-erased threshold voltage ($V_{t,UV}$), device width, length, coupling ratios, and the balance point Vg*. Vg* is a constant for one certain device at a certain Vd. Vth* is determined by the drain disturb voltage, the gate disturb voltage, and $V_{t,UV}$. However, Vg* is a function of the channel length of the device, the drain junction and substrate doping concentration.

The gate voltage at the balance point Vg* for a flash EPROM device disturbed the steady-state threshold voltage Vth* with drain voltage Vd and gate voltage Vg can be represented by the following equation:

$$V_g^* = \alpha_d V_d + \alpha_g V_g - \alpha_g (V_{th}^* - V_{t,UV})$$

$\alpha d$ and $\alpha g$ are the device drain and gate coupling ratios, and Vg is the gate voltage. $\alpha d = cd/(Cg+Cs+Cd+Csub)$. Cd is the coupling capacitance between the drain and the floating gate. Cg is the coupling capacitance between the gate and the floating gate. Cs is the coupling capacitance between the source and the floating gate, and Csub is the coupling capacitance between the substrate and the floating gate. Thus, $\alpha g = Cg/(Cg+Cs+Cd+Csub)$. $V_{t,UV}$ is equal to the UV-erased threshold voltage. Rewriting the equation for Vg* to solve for Vth*, the equation becomes a function of the following parameters:

$$Vth^* = V_{t,UV} + (\alpha d/\alpha g)Vd + V_g - V_g^*/\alpha_g$$

From the equation, Vth* can be controlled and designed to a desired value. With respect to the first term, Vth* is linearly proportional to $V_{t,UV}$. The second term of the equation provides that Vth* can be controlled through Vd because the ratio of $\alpha d/\alpha g$ is approximately 0.2. Most importantly is the third term of the equation. It provides that Vth, is directly related to Vg. According to the equation, the point at which Vth* occurs can be changed by varying the value Vg. The steady-state threshold voltage Vth* can be offset by either a positive or a negative gate voltage Vg.

Referring to FIG. 4, select circuit 100 is used to apply a gate voltage to after erased memory cells. Inputs VPX 150, XIN 160, and XT 155 are set to logic high or Vcc. XDS 170 is set to the gate voltage to be applied to the memory cells. XT 155 applies a logic high to the gates n-channel device 109 and p-channel device 102. The logic high turns off p-channel device 102 and causes n-channel device 109 to turn on or conduct. Node 105 receives the logic high signal of XIN 160. The logic high turns off p-channel device 106 and turns on n-channel device 108 which couples XDS 170, the applied gate voltage with WL 165, the word line. WL 165 is coupled to the gate of the memory cells.

Figure 7:
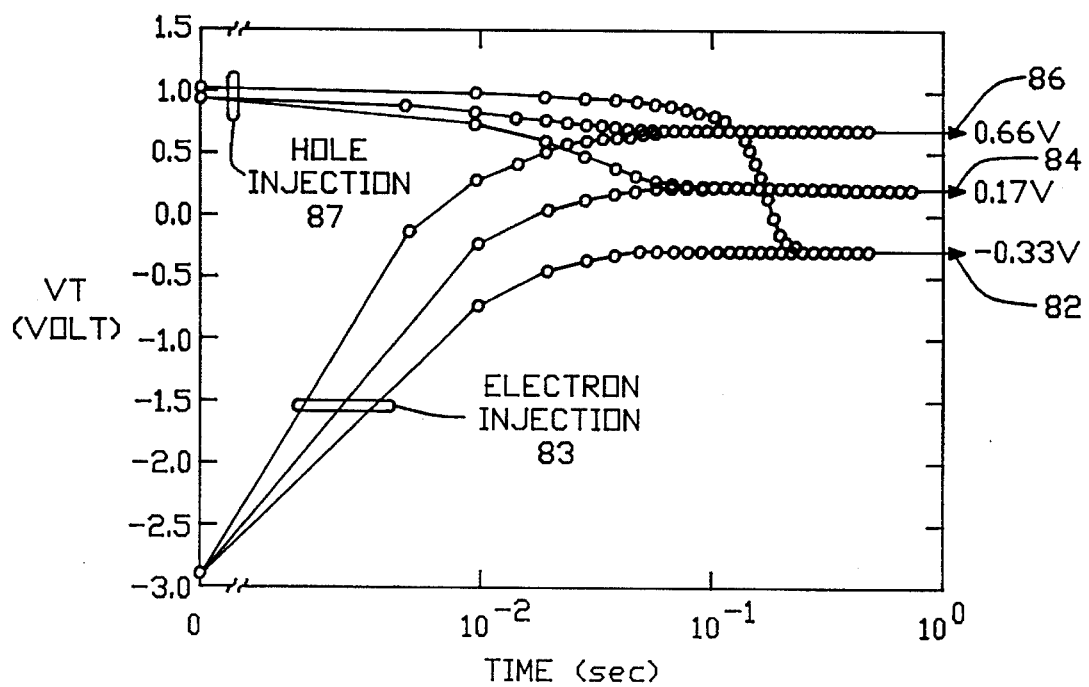
FIG. 7 is a plot of threshold voltage versus time showing the effect of different gate voltages to the steady-state convergence threshold voltage.

FIG. 7 presents experimental data verifying the derivation of the equation that Vth* is directly related to Vg. A drain disturb voltage and a gate voltage is applied to converge the threshold voltages of memory cells to a steady state. Three sets of data are represented in FIG. 7. A drain disturbed voltage Vd of 6.5 volts is applied to each of the three data sets. Data trace 82 is derived by applying 0 volts at the gate of the memory cells. Data trace 84 is derived by applying a gate voltage of 0.5 volts, and data trace 86 is derived by applying 1.0 volts at the gate. Each application of a greater gate voltage Vg shifts the steady-state threshold voltage upward. The data indicates that there is essentially a direct relationship between the gate voltage Vg and the voltage shift in the steady-state threshold voltage. The data results confirm the relationship between the steady-state convergence voltage Vth* and the gate voltage Vg as set out in the equation.

Employing the relationship of the gate voltage Vg and steady-state threshold voltage, FIG. 8 represents a data plot applying a gate voltage Vg to the after erase distribution 75 during self-convergence. The X-axis represents the drain disturbed time in seconds, and the Y-axis represents the threshold voltage for a memory cell. The application of the gate voltage Vg in conjunction with the application of the drain voltage Vd during self-convergence operates to shift the steady-state threshold voltage. A drain voltage of 6.5 volts and a gate voltage of 1.0 volts are applied to the memory cells in distribution 75. In FIG. 8 the old steady-state threshold voltage Vth* 74 is shifted to equal the UV-erased threshold voltage 72. The shift in the steady-state threshold voltage is directly related to the applied gate voltage Vg. An applied gate voltage Vg of 1.0 volts shifts the steady-state threshold voltage 1.0 volts.

Region 79 of the after erase distribution 75 represents the region where electrons are injected into the floating gate to increase the threshold voltage to the steady-state threshold voltage. Region 78 of the after erase distribution 75 represents where holes are injected into the floating gate to decrease the threshold voltage to the steady-state threshold voltage. The number of elections injection into the gate, region 79, is much larger than the number of holes injected into the gate, region 78. Comparing regions 78 and 79 of FIG. 8 with regions 78 and 79 of FIG. 5a indicates that the application of gate voltage Vg during self-convergence, has substantially increased electron injection and has substantially reduced hole injection in the memory cells. Reducing hole injections greatly increases the reliability of memory cells. Hole injection is considered a serious cause of oxide degradation.

Oxide degradation reduces the charge retention abilities of a memory cell and reduces the programming speed of the memory cell. The transconductance (gm) of the memory cell is degraded when oxide degradation occurs. The transconductance (gm) is linearly proportional to the drain current. If the drain current is reduced as a result of gm degradation, the read current which effects the programming speed of the memory cell is also reduced. The endurance of the memory cell to sustain repeated programming and reprogramming is adversely effected.

With the application of gate voltage Vg during the self-convergence operation, it is possible to design a cell array that eliminates region 78 and hole injection. By varying the gate voltage Vg, the size of region 78 and hole injection can be controlled. The applied gate voltage Vg is typically within the voltage range of the 5 volts power supply and can be derived from the 5 volts power.

Shifting the steady-state threshold voltage closer to the UV-erased threshold voltage UV-Vt provides a tighter after erase threshold voltage distribution. Referring to FIG. 5a, the steady-state threshold voltage 74 is almost 2 volts lower than the UV-erased threshold voltage 72. By the application of the gate voltage Vg in FIG. 8, the disparity between steady-state threshold voltage 74 and UV-erased threshold voltage 72 is eliminated. A substantially tighter after erase threshold voltage distribution is achieved.

A tightened threshold voltage distribution offers a wider voltage tolerance which reduces column leakage of memory cells during low voltage read operations. The designed safety margin for ensuring valid read operations can be reduced. Therefore, more efficient and reliable memory devices can be designed. The memory devices can endure greater number of programming and reprogramming cycles which increases the usable life of the memory devices. By reducing the designed safety margin, memory devices capable of lower voltage requirements can be realized.

In memory arrays that utilize double density and triple density applications, it is even more essential and advantageous to control the threshold voltages of the memory cells and achieve a tight threshold voltage distribution. The application of a gate voltage during self-convergence operation can be applied to double density and triple density applications to control the multiple threshold voltage levels.

FIG. 9 shows the characteristics of the gate current Ig as a function of the gate voltage Vg, and the substrate current Isub as a function of the gate voltage Vg. The plot is obtained when the self-convergence mechanism is applied to memory cells in the preferred embodiment. The X-axis is the gate voltage Vg, and the Y-axis is the log of the gate current Ig and the substrate current Isub. Analysis of FIG. 9 reveals that the application of a gate voltage Vg during the self-convergence mechanism does not slow down the erase speed. In analyzing the effect of the gate voltage Vg, there are two speeds to consider. One speed is for electron injection which raises the threshold voltage of erased memory cells. The second speed is for hole injection which lowers the threshold voltages of erased memory cells.

Referring to FIG. 9, Vg* 95 represents the point where hole injection and electron injection are in balance. It is the steady-state threshold voltage that is achieved by the self-convergence mechanism. The effect of the application of the gate voltage Vg on the speed of electron injection can be determined with reference to points 90 and 94. Reference point 90 corresponds to the start point with the gate voltage Vg at 0 volts. Reference point 94 corresponds to the start point with Vg at 1 volts. The gate current Ig corresponding to reference point 94 is much larger than the gate current corresponding to reference 90. Given that the time it takes to move from reference point 94 to reference point 90 is much shorter than the time it takes to move from reference point 90 to Vg* 95, the speed at which the memory cells reach steady-state for Vg=0 volts and Vg=1 volts are almost identical.

With respect to the effect on hole injection speed, the application of a gate voltage Vg actually increases the convergence to steady-state of the memory cells. Reference point 92 corresponds to the start point with the gate voltage Vg at 0 volts. Reference point 96 corresponds to the start point with Vg at 1 volts. The gate current at reference point 92 is on the left side of the gate current peak and is smaller than the gate current at reference point 96. The application of the gate voltage Vg places the start point closer to Vg*. Therefore, it is much faster for reference point 96 to reach Vg* than it is for reference point 92.

FIG. 7 reconfirms that the application of the gate voltage during self-convergence can actually increase the speed of the erase operation. Comparing data trace 82 with data trace 86 for electron injection 83 affirms that the time difference to reach steady-state between Vg=0 volts and Vg=1 volts are negligible. FIG. 7 indicates that electron injection 83 achieves steady-state sooner than hole injection 87. The speed at which steady-state is achieved is dependent on hole injection 89. Comparing data trace 86 with data trace 82 for hole injection 87 affirms that the time it takes to reach steady-state with a Vg voltage applied is less than it takes for Vg=0 volts. Therefore, the application of a gate voltage Vg during the self-convergence mechanism increases the speed at which memory cells achieve the steady-state threshold voltage.

Increased power consumption is always a concern when additional power is required in a memory array. The application of a gate voltage Vg to a single memory cell during drain disturb requires a negligible amount of extra power. This is shown in the case of over-erased cells with threshold voltages of −4 volts. The application of gate voltage Vg=0 volts and Vg=1 volts is compared. Referring to FIG. 9, the difference in power consumption is the time to move from reference point 94 to reference point 90. The time is very short compared with the time it takes to move from reference point 90 to Vg, 95. The additional power required is minimal. The experimental data in FIG. 7 reconfirms the comparison. FIG. 7 indicates that with Vg=1 volts, the time it takes to shift the threshold voltage from −4 volts to −3 volts is less than $10^{-3}$ second or one-one thousandth of a second. The time required for the extra power is very short and the difference in extra power consumption is minimal.

Referring the FIG. 4a, it can be seen that during an erase operation, the drain disturbed voltage is applied to the entire column. Even in the case where most of the bits are not over-erased and have low leakage current, the large number of bits (e.g., 250 bits), can increase the leakage contribution from the main population bits when the gate voltage Vg is applied.

The amount of leakage current can be reduced by performing the gate induced self-convergence on a byte-by-byte basis rather than a column-by-column basis. By reducing the number of bits being induced with gate voltage Vg, the leakage current is limited so that the existing power supply can supply the current and voltage. Erasing the memory cells byte-by-byte obviates the need for over-erased bits searching circuits and reduces the complexity of erase circuits. Performing the erase operation byte-by-byte does increase the time to complete the erase operation. If power consumption is not of concern, an increased number of memory cells can be operated on at one time. A device design may operate on a half or a quarter of a sector or any other variations thereof depending on the capacity of the power supply.

While the present invention has been particularly described with references to FIGS. 1 through 9, and with emphasis on flash memory circuits, it should be understood that the figures are for illustration only and should not be taken as limitations on the invention. In addition, it is clear that the method and apparatus of the present invention have utility in many applications where altering the threshold voltage of devices are required. It is contemplated that many changes and modifications may be made by one of ordinary skill in the art without departing from the spirit and scope of the invention as this invention is disclosed.

That which is claimed is:

1. A flash EPROM comprising:
   an array of memory cells having gates, sources and drains, said sources coupled to one or more source lines;
   a plurality of bit lines, each bit line of the plurality of bit lines being a coupling of the drains of a column of cells in the array;

a plurality of word lines, each word line of the plurality of word lines being a coupling of the gates of a row of cells in the memory array;

a first voltage source coupled to at least a subset of the bit lines, the first voltage source having a first voltage to converge threshold voltages of erased memory cells, said first voltage not being ground; and a second voltage source coupled to at least a subset of the word lines, the second voltage source having a second voltage to offset the threshold voltages of the erased memory cells, said second voltage not being ground.

2. The flash EPROM of claim 1 wherein:

the first voltage causes hole injection and electron injection to converge the threshold voltages of the erased memory cells; and the second voltage controls the threshold voltages of the erased memory cells so that hole injection can be reduced.

3. The flash EPROM of claim 1 wherein the second voltage is derived from the first voltage.

4. The flash EPROM of claim 1, wherein:

the first voltage source causes the threshold voltages to converge to a steady state threshold voltage; and the second voltage source offsets the steady state threshold voltage.

5. A memory cell comprising:

a control gate;

a floating gate;

a source coupled to ground;

a drain;

a first voltage source, having a first voltage, coupled to the drain to obtain a steady-state threshold voltage for said memory cell, said first voltage not being ground; and a second voltage source having a second voltage, coupled to the control gate to offset the steady-state threshold voltage, said second voltage not being ground.

6. The memory cell of claim 5 wherein the second voltage is less than the first voltage.

7. The memory cell of claim 5 wherein the second voltage offsets the steady-state threshold voltage to a greater threshold voltage.

8. The memory cell of claim 5, wherein hot carriers are injected to obtain the steady-state threshold voltage.

9. The memory cell of claim 8 wherein the hot carrier injection includes hot-electron injection into the floating gate to obtain the steady-state threshold voltage.

10. The memory cell of claim 8 wherein the hot carrier injection includes hot-hole injection of the floating gate to obtain the steady-state threshold voltage.

11. A flash EPROM comprising;

an array of memory cells, the memory cells including gates, sources and drains, said sources being coupled to one or more source lines, said array of memory cells including a first set of erased memory cells and a second set of erased memory cells, each of the first set of memory cells having a threshold voltage and the first set of memory cells collectively having a first threshold voltage distribution, each of the second set of memory cells having a threshold voltage and the second set of memory cells collectively having a second threshold voltage distribution;

a plurality of bit lines, each coupled to the drains of a column of cells in the memory array;

a plurality of word lines, each coupled to the gates of a row of cells in the memory array;

a first voltage source, coupled to at least a subset of the bit lines, having a first voltage to converge the threshold voltages of the second set of erased memory cells, said first voltage not being ground; and a second voltage source, coupled to at least a subset of the word lines, having a second voltage to offset the threshold voltages of the second set of erased memory cells, said second voltage not being ground.

12. The flash EPROM of claim 11 wherein the erased memory cells are erased by Fowler-Nordheim tunneling.

13. The flash EPROM of claim 11 wherein the second voltage offsets the second threshold voltage distribution of the second set of erased memory cells towards the first threshold voltage distribution.

14. The flash EPROM of claim 11 wherein the threshold voltages of the second set of erased memory cells are converged by hot carrier injection.

15. The flash EPROM of claim 14, wherein:

the memory cells include floating gates; and the hot carrier injection includes hot-electron injection and hot-hole injection of the floating gates of the second set of erased memory cells.

16. The flash EPROM of claim 15 wherein the second voltage controls the second threshold voltage distribution of the second set of erased memory cells to reduce hot-hole injection of the floating gates of the second set of erased memory cells.

17. The flash EPROM of claim 11 wherein the first voltage coupled to the bit lines converges the threshold voltages of the second set of erased memory cells to a steady-state threshold voltage.

18. The flash EPROM of claim 17 wherein the second voltage coupled to the word lines shifts the steady-state threshold voltage towards the first threshold voltage distribution.

19. The flash EPROM of claim 18 wherein the first voltage coupled to the bit lines does not disturb the first threshold voltage distribution.

20. A method of erasing a memory, the memory including a set of memory cells, each of the memory cells having a source, a drain, a floating gate and a control gate, the method comprising the steps of:

electrically erasing the memory cells, each of the memory cells having a threshold voltage;

applying a drain disturb voltage to the drains of the erased memory cells so that the threshold voltages of the erased memory cells converge toward a steady state threshold voltage, said drain disturb voltage not being ground; and applying a gate voltage so that the steady state threshold voltage is offset, said gate voltage not being ground.

21. The method of claim 20, wherein:

the step of applying a drain disturb voltage injects holes and electrons to achieve a tight threshold distribution, and the step of applying a gate voltage reduces the injection of holes.

22. The method of claim 20, further including the step of grounding the sources of the memory cells.

23. A method of controlling voltage thresholds of memory cells in an electrically erased flash EPROM, the memory cells including a source, a drain, a floating gate and a control gate, the method comprising the steps of:

applying a drain voltage to the drains of the cells to inject hot-holes and hot-electrons into the floating gate to converge the threshold voltages of the cells to a certain steady-state threshold voltage, said drain voltage not being ground; and applying a gate voltage to the cells to control the threshold voltages of the cells to a second steady-state threshold voltage, said gate voltage not being ground.

24. The method of claim 23, wherein the step of applying a gate voltage reduces the injection of the hot-holes into the floating gate.

25. A method of claim 23, wherein the step of applying a gate voltage increases the injection of hot-electrons into the floating gate.

26. A method of claim 23, further including the step of grounding the sources of the memory cells.

27. A flash EPROM comprising:

an array of memory cells, each cell having a floating gate, a control gate, a source and a drain, said sources coupled to one or more source lines;

a plurality of bit lines, each bit line of the plurality of bit lines being a coupling of the drains of a column of cells in the array;

a plurality of word lines, each word line of the plurality of word lines being a coupling of the gates of a row of cells in the memory array;

means for converging threshold voltages of erased memory cells toward a steady state threshold voltage; and means for offsetting the steady state threshold voltage.

28. The flash EPROM of claim 27, wherein:

said means for converging drives a first voltage on the bit lines of the erased memory cells; and said means for offsetting drives a second voltage on the word lines of the erased memory cells.

29. The flash EPROM of claim 28, wherein said second voltage is less than or equal to 1.0 volt and greater than or equal to 0.5 volts.

30. A flash EPROM comprising:

an array of memory cells, each cell having a floating gate, a control gate, a source and a drain, said sources coupled to one or more source lines;

a plurality of bit lines, each bit line of the plurality of bit lines being a coupling of the drains of a column of cells in the array, said bit lines adapted to receive a first voltage to converge threshold voltages of erased memory cells toward a steady state threshold voltage, said first voltage not being ground;

a plurality of word lines, each word line of the plurality of word lines being a coupling of the control gates of a row of cells in the memory array;

a select circuit adapted to drive a second voltage on said word lines to offset the steady state threshold voltage, said second voltage not being ground.

31. The flash EPROM of claim 30, wherein:

the first voltage causes hole injection and electron injection to converge the threshold voltages of the erased memory cells; and the second voltage controls the threshold voltages of the erased memory cells so that hole injection can be reduced.

32. A memory cell having a threshold voltage, comprising:

a control gate;

a floating gate;

a source:

a drain, wherein grounding said source and driving said drain with a first voltage cause said threshold voltage to approach a steady state threshold voltage, said first voltage not being ground; and a driver circuit adapted to drive a second voltage on said control gate to offset the steady state threshold voltage, said second voltage not being ground.

33. The memory cell of claim 32, wherein hot carriers are injected to obtain the steady-state threshold voltage.

34. The memory cell of claim 33, wherein the hot carrier injection includes hot-electron injection into a floating gate to obtain the steady-state threshold voltage.

* * * * *

UNITED STATES PATENT AND TRADEMARK OFFICE
CERTIFICATE OF CORRECTION

PATENT NO. : 5,521,867
DATED : May 28, 1996
INVENTOR(S) : Chen et al.

It is certified that error appears in the above-indentified patent and that said Letters Patent is hereby corrected as shown below:

Col. 16, line 26: after "source" delete ":"
and substitute therefor --;--.

Signed and Sealed this

First Day of July, 1997

Attest:

BRUCE LEHMAN

Attesting Officer            Commissioner of Patents and Trademarks